(12) United States Patent
Foley et al.

(10) Patent No.: US 10,110,218 B2
(45) Date of Patent: Oct. 23, 2018

(54) INTEGRATED BIASING FOR PIN DIODE DRIVERS (71) Applicant: MACOM Technology Solutions Holdings, Inc., Lowell, MA (US)

(72) Inventors: Brendan Foley, County Wexford (IE); Cristiano Bazzani, Irvine, CA (US); Michelle Dowling, County Cork (IE)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 0 days.

(21) Appl. No.: 15/356,322

(22) Filed: Nov. 18, 2016

(65) Prior Publication Data
US 2018/0145680 A1 May 24, 2018

(51) Int. Cl.
H03K 17/567 (2006.01)
H03K 17/28 (2006.01)
H03F 3/19 (2006.01)
G05F 1/46 (2006.01)

(52) U.S. Cl.
CPC ............ H03K 17/567 (2013.01); H03F 3/19 (2013.01); H03K 17/28 (2013.01); G05F 1/46 (2013.01); H03F 2200/294 (2013.01); H03F 2200/451 (2013.01); H05K 999/99 (2013.01)

(58) Field of Classification Search
CPC ......... H01L 2924/0002; H01L 2924/00; H01L 22/14; H03K 17/08122
USPC .................. 327/108, 109, 110, 111, 112
See application file for complete search history.

(56) References Cited

U.S. PATENT DOCUMENTS

| 6,424,232 | B1* | 7/2002 | Mavretic ......... H01J 37/32082 333/17.3 |
| 7,109,801 | B2 | 9/2006 | Li |
| 7,746,156 | B1 | 6/2010 | Massie et al. |
| 8,026,636 | B2 | 9/2011 | Oh |
| 2003/0015767 | A1 | 1/2003 | Emrick et al. |
| 2003/0102912 | A1 | 6/2003 | Tripathi et al. |
| 2005/0213354 | A1 | 9/2005 | Pai |
| 2007/0004343 | A1 | 1/2007 | Kandola et al. |
| 2008/0180176 | A1 | 7/2008 | Lee |
| 2009/0108794 | A1 | 4/2009 | Ochiai et al. |
| 2010/0073088 | A1 | 3/2010 | Wimpenny et al. |
| 2011/0050036 | A1 | 3/2011 | Gilardi |
| 2011/0181324 | A1 | 7/2011 | Gesche et al. |
| 2011/0279185 | A1 | 11/2011 | Lautzenhiser |
| 2013/0121044 | A1 | 5/2013 | Gao et al. |
| 2013/0207726 | A1 | 8/2013 | Tadano |
| 2014/0184334 | A1 | 7/2014 | Nobbe et al. |
| 2015/0188496 | A1 | 7/2015 | Kim |
| 2018/0061984 | A1 | 3/2018 | Achiriloaie et al. |

(Continued)

OTHER PUBLICATIONS

PCT/US2017/048621, Nov. 30, 2017, International Search Report and Written Opinion.

(Continued)

Primary Examiner — John Poos
(74) Attorney, Agent, or Firm — Wolf, Greenfield & Sacks, P.C.

(57) ABSTRACT

Radio-frequency signals may be switched between signal lines or signal ports in RF circuits using PIN diodes and PIN-diode driving circuitry. To achieve switching, the PIN diodes are biased at voltages as high as 20 volts or more. Circuitry for biasing PIN diodes is described that uses a low-voltage power source and a single-bit control line.

25 Claims, 3 Drawing Sheets (56) References Cited

U.S. PATENT DOCUMENTS

2018/0145681 A1  5/2018  Foley et al.
2018/0145682 A1  5/2018  Foley et al.

OTHER PUBLICATIONS

U.S. Appl. No. 15/619,236, filed Jun. 9, 2017, Patterson et al.
[No Author Listed], TPS6513x Positive and Negative Output DC-DC Converter. Texas Instruments. Jan. 2016. 33 pages.
International Search Report and Written Opinion for Application No. PCT/US2017/048621 dated Nov. 30, 2017.
U.S. Appl. No. 15/356,336, filed Nov. 18, 2016, Foley et al.
U.S. Appl. No. 15/356,355, filed Nov. 18, 2016, Foley et al.
U.S. Appl. No. 15/250,220, filed Aug. 29, 2016, Achiriloaie et al.

\* cited by examiner

INTEGRATED BIASING FOR PIN DIODE DRIVERS

BACKGROUND

Technical Field

The technology relates to driving circuitry for PIN diodes.

Discussion of the Related Art

Semiconductor diodes with wide, intrinsic semiconductor regions between p-type and n-type semiconductor regions on either side of the diode junction are referred to as "PIN" diodes. PIN diodes can be used in radio-frequency (RF) applications as switches and/or attenuators, and may be used in other applications as photodetectors and photovoltaic cells. When a PIN diode is forward biased, the PIN diode becomes conductive and can readily pass an RF signal. Under forward bias, the PIN diode essentially appears as a short. When at zero bias or reverse bias, a PIN diode is mainly a capacitive element, since the intrinsic region of the diode is depleted of carriers, and may effectively block an RF signal. The capacitance of a PIN diode can be small (e.g., on the order of 1 pF or less). Because a PIN diode has small capacitance, it can be switched at high speed between conductive and capacitive states which makes it attractive for RF applications.

SUMMARY

Structures and methods for controlling and biasing PIN diodes are described. According to some embodiments, driving circuitry for PIN diode switches, which require voltages of about 20 volts or more, may use only a single low-voltage supply and a single-bit control signal to operate the PIN diodes. The PIN diodes may be arranged in a circuit to switch RF signals to and from an antenna in mobile communication applications.

Some embodiments relate to a driver circuit for biasing PIN diodes. The driver circuit may comprise a substrate on which the driver circuit is assembled, a supply voltage contact configured to receive electrical power from a power source, and a boost converter connected to the supply voltage contact and configured to increase a first voltage received from the power source to a second voltage. The driver circuit may further include a low-dropout regulator configured to convert the second voltage to a third voltage, and PIN diode bias driver circuitry connected to an output of the low-dropout regulator and arranged to drive at least one PIN diode.

In some aspects, the boost converter may comprise two transistors and switching circuitry configured to switch current through an inductor that attaches to two inductor contacts on the substrate that are connected to the two transistors.

In some implementations, an input of the low-dropout regulator is arranged to connect to a cathode of a diode having an anode that connects to the inductor.

In some aspects, the first voltage is between approximately 2.5 volts and approximately 7 volts and the second voltage is between approximately 20 volts and approximately 35 volts. The third voltage may be less than the second voltage and may be between approximately 19 volts and approximately 34 volts.

In some implementations, the supply voltage contact is the only contact for receiving power that powers the driver circuit.

According to some implementations, the PIN diode driver circuitry comprises a receive PIN diode biasing circuit connected to an output of the low-dropout regulator, a transmit PIN diode biasing circuit connected to the output of the low-dropout regulator, and a shunt PIN diode biasing circuit connected to the output of the low-dropout regulator.

In some aspects, a PIN diode driver circuit may further comprise a TTL buffer configured to receive commands to activate or deactivate the receive PIN diode biasing circuit, the transmit PIN diode biasing circuit, and the shunt PIN diode biasing circuit. In some implementations, the TTL buffer is further configured to output an enable signal that indicates when at least one of the receive PIN diode biasing circuit, the transmit PIN diode biasing circuit, or the shunt PIN diode biasing circuit is activated.

According to some aspects, one or more of the receive PIN diode biasing circuit, the transmit PIN diode biasing circuit, and the shunt PIN diode biasing circuit comprises a first transistor having a drain connected to receive an output voltage from the low-dropout regulator, a first buffer configured to receive power from the low-dropout regulator, to be referenced to a reference voltage that is less than a voltage from the low-dropout regulator and greater than zero volts, and to drive a gate of the first transistor, a second transistor having a drain connected to a source of the first transistor, and a second buffer configured to drive a gate of the second transistor. In some implementations, the reference voltage is between 2.5 volts and 7 volts less than a voltage received from the low-dropout regulator. According to some aspects, one or more of the receive PIN diode biasing circuit, the transmit PIN diode biasing circuit, and the shunt PIN diode biasing circuit comprises a first level shifter having an output connected to an input of the first buffer and a second level shifter having an output connected to an input of the second buffer.

In some implementations, the driver circuit further comprises plural PIN diodes assembled on the substrate and connected to the PIN diode driver circuitry. In some aspects, the driver circuit further comprises an antenna contact coupled to a node between a receive PIN diode and a transmit PIN diode of the plural PIN diodes, a receive contact coupled to a node between the receive PIN diode and a shunt PIN diode of the plural PIN diodes, and a transmit contact coupled to the transmit PIN diode, wherein the PIN diode driver circuitry is configured to bias the plural PIN diodes to switch signals from or to the antenna contact between the receive contact and the transmit contact. In some implementations, the driver circuit further comprises a low noise amplifier assembled on the substrate and connected to a cathode of the receive PIN diode.

Some embodiments relate to a method for biasing PIN diodes with a driver circuit. The method may comprise acts of receiving, at the driver circuit, a first supply voltage, wherein the driver circuit is assembled on a substrate. The method may further include acts of increasing, with a boost converter assembled on the substrate, the first supply voltage to a second voltage, reducing, with a low-dropout regulator assembled on the substrate, the second voltage to a third voltage, and powering, with an output from the low-dropout regulator, PIN diode driver circuitry that is assembled on the substrate.

In some aspects, the first supply voltage is the only supply voltage received by the driver circuit.

In some implementations, increasing the first supply voltage to a second voltage comprises switching two transistors to drive current through a single inductor.

In some aspects, the first supply voltage is between approximately 2.5 volts and approximately 7 volts and the second voltage is between approximately 20 volts and approximately 35 volts. According to some implementations, the third voltage is less than the second voltage and is between approximately 19 volts and approximately 34 volts.

According to some implementations, a method may further comprise referencing first buffers in the PIN diode driver circuitry with a reference voltage that is less than an output voltage from the low-dropout regulator and greater than zero volts, and powering, with the first supply voltage, second buffers in the PIN diode driver circuitry.

In some aspects, a method for biasing PIN diodes may further comprise transmitting single-bit control signals to PIN diode bias drivers that alter a bias on the PIN diodes. In some implementations, the PIN diodes are assembled as a switch on the substrate and the control signals cause the PIN diodes to switch RF signals between a receive port and a transmit port of the driver circuit.

A method for biasing PIN diodes may further comprise acts of providing an enable signal for an amplifier responsive to activating the PIN diodes to be in a first state, and activating the amplifier responsive to receiving the enable signal. In some implementations, the amplifier may be a low-noise amplifier connected to the receive port.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate, for example. Additionally, a depicted device or circuit may be integrated within a larger circuit.

When referring to the drawings in the following detailed description, spatial references "top," "bottom," "upper," "lower," "vertical," "horizontal," "above," "below" and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

Microwave and radio frequency (RF) systems, such as mobile phone and radar systems, often include circuitry arranged to switch RF signals between different signal paths or to switch different signals alternately onto a same signal path. One example of RF switching is in a time-division duplex (TDD) system, which may be used in mobile phone communications. In such a system, received RF signals and transmission RF signals may be switched alternately onto and off of a same signal path connected to an antenna that is used to wirelessly transmit and receive communication signals.

One way to switch RF signals is to use PIN diodes in a branching circuit and bias the diodes appropriately to either pass or block RF transmission on each branch, as will be described in further detail below. The inventors have recognized and appreciated that the bias voltage required for the PIN diodes (typically more than 15 volts) is appreciably higher than voltages needed for other electronic components (e.g., buffers, logic chips, ASICs, analog-to-digital and digital-to-analog converters, processors, etc.) of signal processing circuitry in mobile phones and RF systems. This difference in required voltage can present an inconvenience for manufacturers. For example, an additional voltage supply is needed in the system to operate the PIN diodes. It is typically the responsibility of the manufacturer to provide the additional voltage supply or supplies needed for the PIN diodes and driving circuits.

To avoid such inconvenience, the inventors have conceived of driver circuitry that includes a regulated boost converter and PIN diode bias drivers in a single module that can be powered by a single low-voltage source and operated by a single, two-level logic signal, according to some embodiments. In some cases, the PIN diodes may be included within the same module and biased at high voltage by the bias drivers to switch RF signals. The two-level logic signal can be used to obtain a desired biasing sequence of the PIN diodes and to activate amplifiers used to amplify the RF signals.

Figure 1:
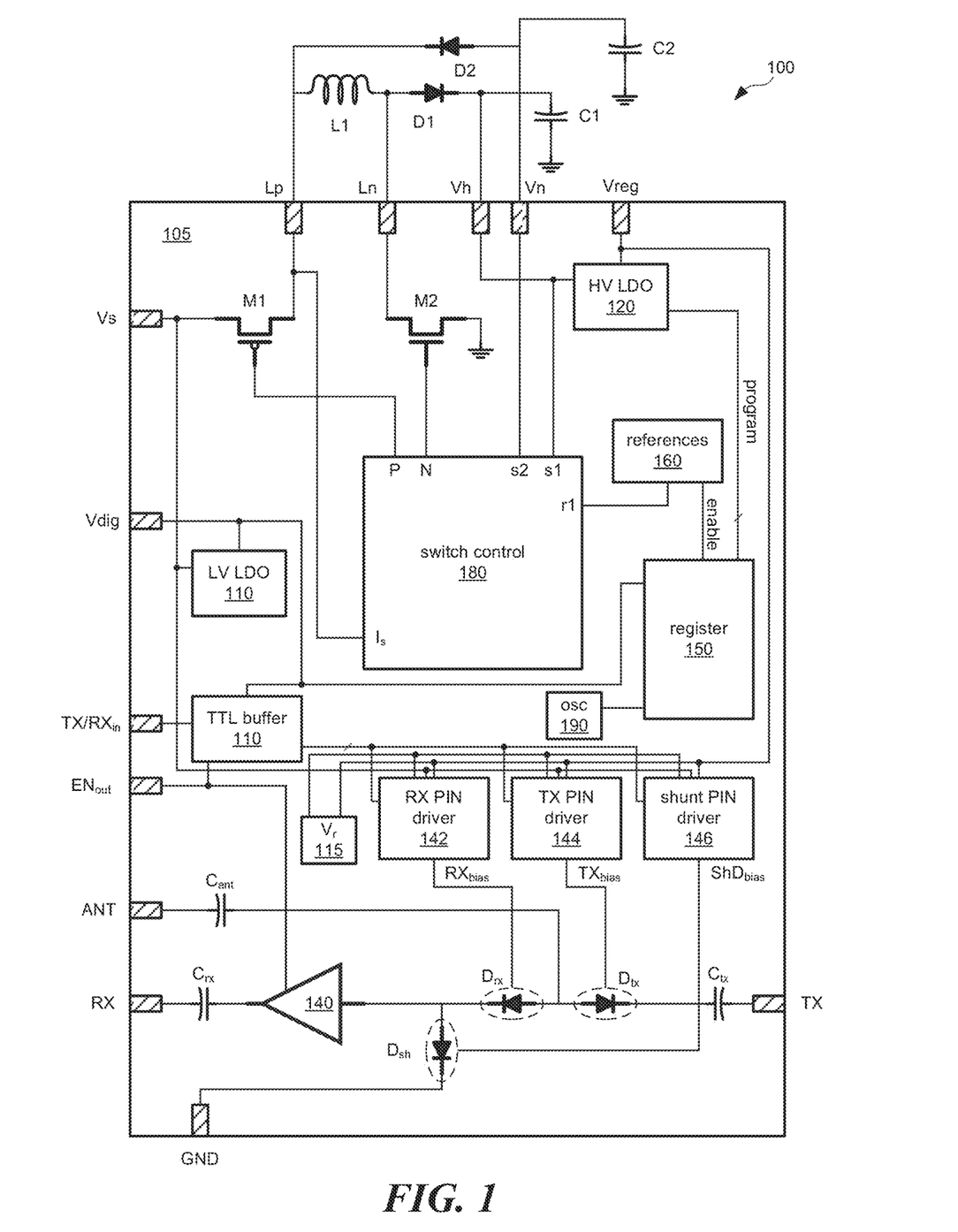
FIG. 1 depicts driving circuitry and PIN diodes which may be assembled into a module powered by a single low-voltage supply, according to some embodiments.

FIG. 1 shows one example of drive circuitry 100 for PIN diodes, which may be incorporated in a single module in some embodiments. The components may be assembled onto a substrate 105 and incorporated into a ceramic or plastic package having multiple contacts on an external surface. The contacts (e.g., pins, tabs, bumps, or pads) may be designed for making separate connections to the drive circuitry within a larger circuit or system (e.g., inserting into a printed circuit board and/or connecting with solder). The substrate 105 may be any suitable insulating substrate (e.g., formed from printed circuit board material or a ceramic) and may include a ground plane or ground interconnects.

In overview, the drive circuitry 100 may include a supply voltage contact (labeled "Vs" in the drawing) to which power may be applied to activate the drive circuitry. In some embodiments, the drive circuitry may be powered with a single source (not shown) that outputs a voltage $V_s$ between about 2.5 volts and about 7 volts, and is capable of providing between about 1 amp and about 6 amps. In some embodiments, the single source may output a voltage $V_s$ between about 2.5 volts and about 7 volts, and provide between about 0.1 amp and about 1 amp. The supply voltage contact Vs may connect to a voltage converter that converts the received low voltage to a first high voltage $V_h$, e.g., between about 20 volts and about 35 volts, that is provided to a high-voltage contact Vh. The output from the voltage converter may be provided to a high-voltage, low-dropout regulator (HV LDO) 120, according to some embodiments, where it is regulated down to a second high-voltage value. The regulated voltage from the HV LDO 120 may be provided to PIN diode bias drivers 142, 144, 146, which are controlled by signals from a transistor-transistor logic (TTL) buffer 110 to apply a desired biasing sequence to PIN diodes. In some embodiments, the biased PIN diodes may be external to the package containing the PIN diode drivers or assembled in a separate package. If the PIN diodes are external, biasing contacts (not shown) may be located at an external surface of the package containing the diode drivers for connecting to the PIN diodes. In some implementations, PIN diodes $D_{rx}$, $D_{tx}$, and $D_{sh}$ may be internal to the package containing the diode drivers, and connected together in a circuit to switch RF signals in a desired manner Although three bias drivers and PIN diodes are depicted in the illustrated embodiments, fewer or more bias drivers and PIN diodes may be used in other implementations.

In further detail, a voltage converter of the drive circuitry 100 may comprise a boost converter that uses a single inductor L1, though other types of voltage converters may be used in other embodiments. The inductor may mount external to the package and connect to inductor contacts Lp and Ln. The boost converter may comprise two or more transistors M1, M2 that are configured to switch current from the supply voltage contact Vs through the inductor L1. In some embodiments, there may be two transistors of opposite type (p-FET, n-FET) connected to switch current through the inductor L1. The switching of the transistors may be controlled by switch control 180. In some implementations, the switch control 180 may comprise circuitry used for single-inductor multiple output (SIMO) converters. The switch control 180 may include two output contacts (P, N) that connect to gates of the transistors M1, M2, and also include a current-sensing contact $I_s$ that connects to a source or drain of one of the transistors M1, to an end of the inductor L1, and to current limiting circuitry with the switch control 180.

Additional components for voltage conversion may include two diodes D1, D2 and two charging capacitors C1, C2 which may be mounted external to the package and connect to boost-converter circuitry within the package via a high-voltage contact Vh and a negative-voltage contact Vn, as indicated in FIG. 1. The high-voltage contact Vh may be configured to connect to a node between a cathode of the first diode D1 and the first capacitor C1, and may also connect to a high-voltage sensing node s1 of the switch control 180. The negative-voltage contact Vn may be configured to connect to a node between an anode of the second diode D2 and the second capacitor C2, and may further connect to a negative-voltage sensing node s2 of the switch control 180. Circuitry within the switch control 180 may monitor the voltages on the capacitors C1, C2 as they are charged and discharged by the switching of transistors M1, M2, and control switch timing based in part on the detected voltages. One or more contacts r1 may be included with the switch control 180 to receive reference voltage values that can be compared against sensed voltage values, and used to maintain output voltages from the voltage converter at desired levels.

According to some embodiments, reference voltage values for the switch control 180 may be provided by reference circuitry 160. Any suitable voltage reference circuitry may be used to provide one or more DC voltage reference values. Examples of voltage reference circuits include Zener diode voltage reference circuits, resistive voltage dividers, and bandgap voltage references, though other voltage reference circuits may be used. In some implementations, hard-wired digital-to-analog converters (DACs) may be included to obtain reference voltage values. According to some embodiments, voltage reference circuits in the reference circuitry 160 may be activated by an enable signal that is transmitted from a register 150 upon start-up.

In some embodiments, drive circuitry 100 may include a programmable HV LDO 120 that receives the converted high voltage $V_h$ (e.g., voltage appearing at C1) from the boost voltage converter. The inventors have recognized and appreciated that the converted high voltage has spikes that result from the switching of transistors M1, M2. These spikes, if passed to the PIN bias drivers 142, 144, 146 may couple onto and add noise to signals that are switched by the PIN diodes. This switching noise generated by the transistors M1, M2 can degrade RF communication signals, for example.

To reduce the switching noise, the boost voltage converter may convert the input voltage $V_s$ to a voltage higher than necessary. The HV LDO 120 may then substantially remove the spikes and provide a regulated voltage at a lower, desired level that is suitable for powering the PIN diode bias drivers 142, 144, 146. According to one embodiment, the boost voltage converter may boost the input supply voltage $V_s$ from a value between about 2.5 volts and about 5.5 volts, to about 23 volts, and the HV LDO 120 may regulate the voltage to about 19.5 volts while substantially removing switching noise from the boost converter. Other voltage values may be used in other embodiments.

According to some implementations, the HV LDO 120 may be programmed with digital data received from a register 150, while in other embodiments, the LDO may be programmed with a signal received from reference circuitry 160. The register may be included in the same package and assembled on the substrate 105. In the drawings, interconnects having a slash indicate digital data lines having more than one bit per digital word. In some cases, the register 150 is hardwired at manufacture to output one or more fixed digital signals that program the output voltage value of the HV LDO 120. In such implementations, the HV LDO may output a constant voltage (e.g., 19.5 volts, though other voltages may be used). An on-board oscillator 190 may be assembled on the substrate 105 (or a clock signal may be received from an external source) and used to clock data to and from the register 150 upon start-up and during operation.

In some implementations, on-board logic and digital elements may operate at supply voltages lower than the supply voltage $V_s$ provided to the voltage supply contact Vs. For example, the provided supply voltage $V_s$ may be about 5 volts, and the on-board logic and digital elements may operate at 3.3 volts or as low as 1.8 volts. According to some embodiments, a second low-voltage (LV) LDO 110 may then be included with the drive circuitry 100 on the substrate 105 within the same package. The LV LDO 110 may receive the same supply voltage $V_s$ used for powering the drive circuitry 100, and output a lower voltage for digital logic.

The output voltage from the LV LDO may be provided to an external contact Vdig for external use and/or monitoring.

In some embodiments, PIN diodes $D_{tx}$, $D_{rx}$, $D_{sh}$ may be assembled on the same substrate 105 and configured to switch RF "receive" and "transmit" signals onto a same antenna line, as indicated in FIG. 1. For example, an antenna line may couple to an external contact ANT via a coupling capacitor $C_{ant}$ and connect to an external antenna that is used to transmit and receive RF signals. The external antenna may be an antenna of a mobile device such as a mobile phone, laptop, or tablet. The antenna line may also connect to a node between an anode of a receive diode $D_{rx}$ and an anode of a transmit diode $D_{tx}$. The receive diode may have a cathode that couples to a receive contact RX via a receive capacitor $C_{rx}$. The transmit diode may have a cathode that couples to a transmit contact TX via a transmit capacitor $C_{tx}$. In some implementations, there may be a shunt diode $D_{sh}$ that connects to a cathode of the receive diode $D_{rx}$ and to a reference voltage, such as ground.

In some cases, the PIN diode switching circuitry may further include a low-noise amplifier 140 having an input connected to a cathode of the receive diode $D_{rx}$ and an output coupled to the receive contact RX. The low-noise amplifier may be used to amplify RF signals received from an antenna (not shown) that is connected to the antenna contact ANT. To reduce energy consumption and/or avoid amplifier damage, the low-noise amplifier 140 may be deactivated for a period of time when signal amplification is not needed, and receive an activation or enable signal from the TTL buffer 110 when needed. For example, the low-noise amplifier may be shut off or placed in a low-power state when signals are being transmitted, and then activated just prior to changing circuit operation from a transmitting mode to a receiving mode. According to some embodiments, a time-delayed signal may be provided from the TTL buffer 110 that ensures the low-noise amplifier is not activated until after the PIN diode switches have been set to a receive mode. In some implementations, the enable signal may also be provided to an enable contact $EN_{out}$ for controlling other amplifiers or circuits that are used in combination with the PIN driver circuitry 100. In some cases, the low-noise amplifier 140 may be shut off immediately prior to switching to a next operating mode and turned on after the PIN diodes are biased in a receive mode to avoid receiving switching transition noise and spikes at the low-noise amplifier.

Biasing circuitry (indicated by dashed ovals around the PIN diodes, details not shown) may be arranged to apply bias voltages across each PIN diode junction to control the RF transmission characteristics of the diodes. Any suitable DC biasing circuitry may be used. The biasing circuitry may include biasing inductors connected to cathodes or anodes of the PIN diodes, wherein the biasing inductors are arranged to couple a DC bias onto the RF signal lines across the diode junctions. The biasing circuitry may further include capacitive shunts connected to the biasing inductors to help shunt noise and reduce coupling the noise to the signal lines.

According to some embodiments, transmit signals from the transmit contact TX may be switched onto the antenna line and to the antenna contact ANT by not biasing or reverse biasing the receive diode $D_{rx}$ and optionally forward biasing the transmit diode $D_{tx}$ and shunt diode $D_{sh}$. Received signals from the external antenna may be switched to the receive contact RX by not biasing or reverse biasing the transmit diode $D_{tx}$ and shunt diode $D_{sh}$ and optionally forward biasing the receive diode $D_{rx}$. In some implementations, a constant low-voltage forward bias may be applied to the diodes to obtain conducting states, and applied reverse biases may override the small forward bias.

When a single high-voltage supply (e.g., $V_{reg}$) is used to bias the PIN diodes, then the PIN diodes may alternate between states of reverse bias and no bias. In the above example, the shunt diode and transmit diode are biased together to be in a same state. The receive diode is biased separately to be in an opposite state.

From the foregoing description of PIN diode biasing, it may be appreciated that only two bias states are needed to connect transmit or receive signals to the antenna line. In such embodiments, a one-bit control signal (hi, lo) may be provided to the TTL buffer 110 (via a transmit/receive input contact $TX/RX_{in}$) to control the PIN diode switches when switching the RF signals.

Figure 2:
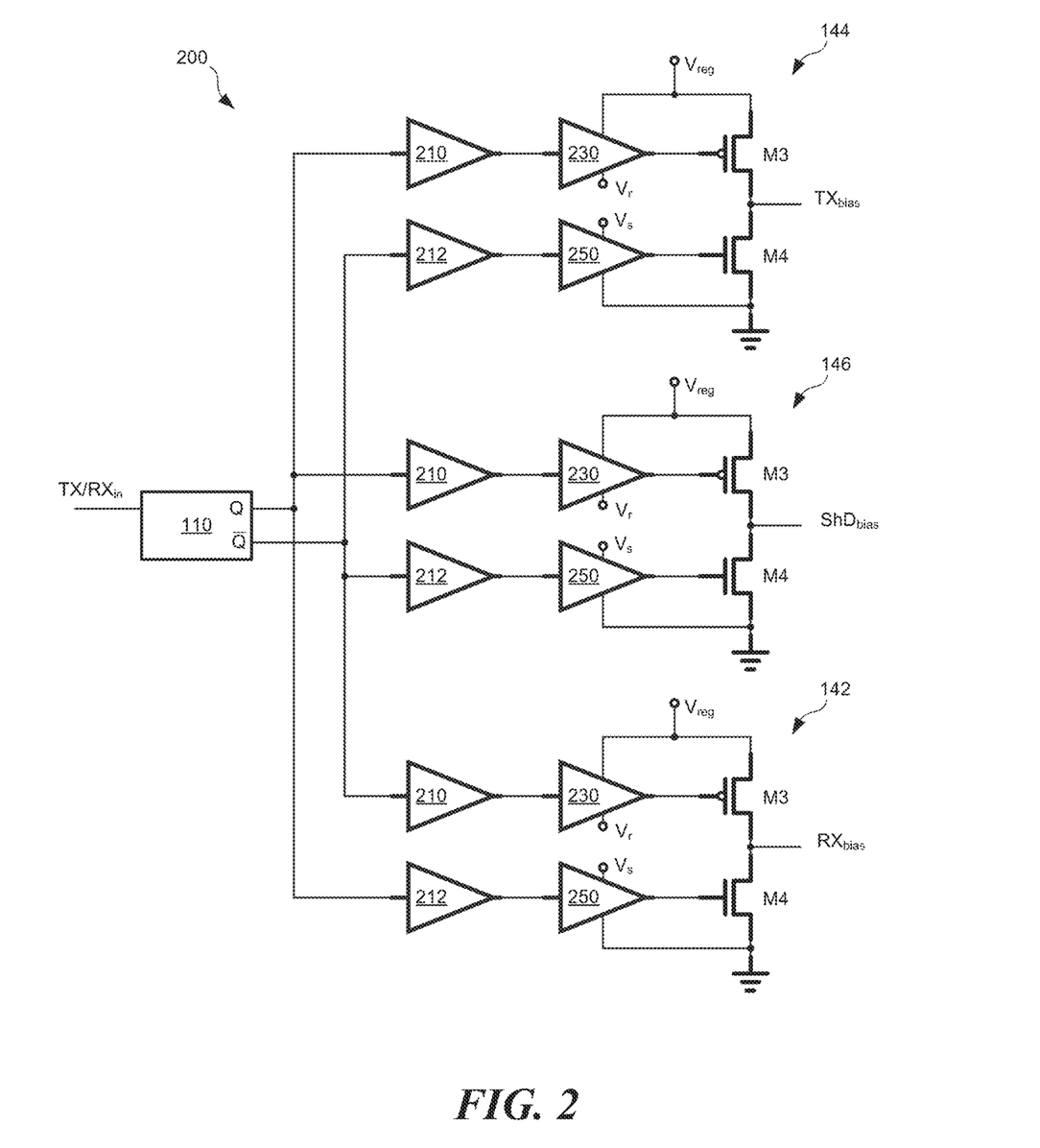
FIG. 2 depicts components of PIN diode bias drivers, according to some embodiments.

FIG. 2 depicts PIN diode bias drivers 142, 144, 146, according to some embodiments. Alternative bias driver circuits may be used in some implementations. Each bias driver may be configured to switch an output node $TX_{bias}$, $RX_{bias}$, $ShD_{bias}$ between the regulated voltage $V_{reg}$ output from the HV LDO 120 and a low voltage, e.g., a ground, near-ground, or other low-voltage reference potential. According to some embodiments, each bias driver may comprise a pair of level shifters 210, 212 configured to receive enable or not-enable signals from the TTL buffer 110. One branch of a bias driver may control a first transistor M3 via a first buffer 230, and a second branch of the bias driver may control a second transistor M4 via a second buffer 250. The second transistor M4 may be of opposite conductivity type than that of the first transistor M3.

In some implementations, the buffers 230, 250 may be low-voltage buffers of the same type (e.g., 5-volt buffers). However, the supply and reference voltages for each buffer may differ. For example, the first buffer 230 may be configured to drive a p-type transistor M3 that switches the high voltage $V_{reg}$ onto and off the biasing node (e.g., $TX_{bias}$). Accordingly, its supply voltage may be $V_{reg}$ and its reference voltage $V_r$ may be about 5 volts below $V_{reg}$. The reference voltage $V_r$ may be provided by a voltage reference circuit 115, referring again to FIG. 1. In some cases, the reference voltage $V_r$ and its circuit may be included in reference circuitry 160. Level shifter 210 may shift the voltage level from TTL buffer 110 to a higher value that is suitable for operating the first buffer 230.

The second buffer 250 may be configured to drive an n-type transistor M4 that switches a low voltage or ground potential onto the biasing node. The second buffer 250 may receive the supply voltage $V_s$ used for powering the driver circuitry 100, and receive a reference voltage at ground potential, for example.

Figure 3:
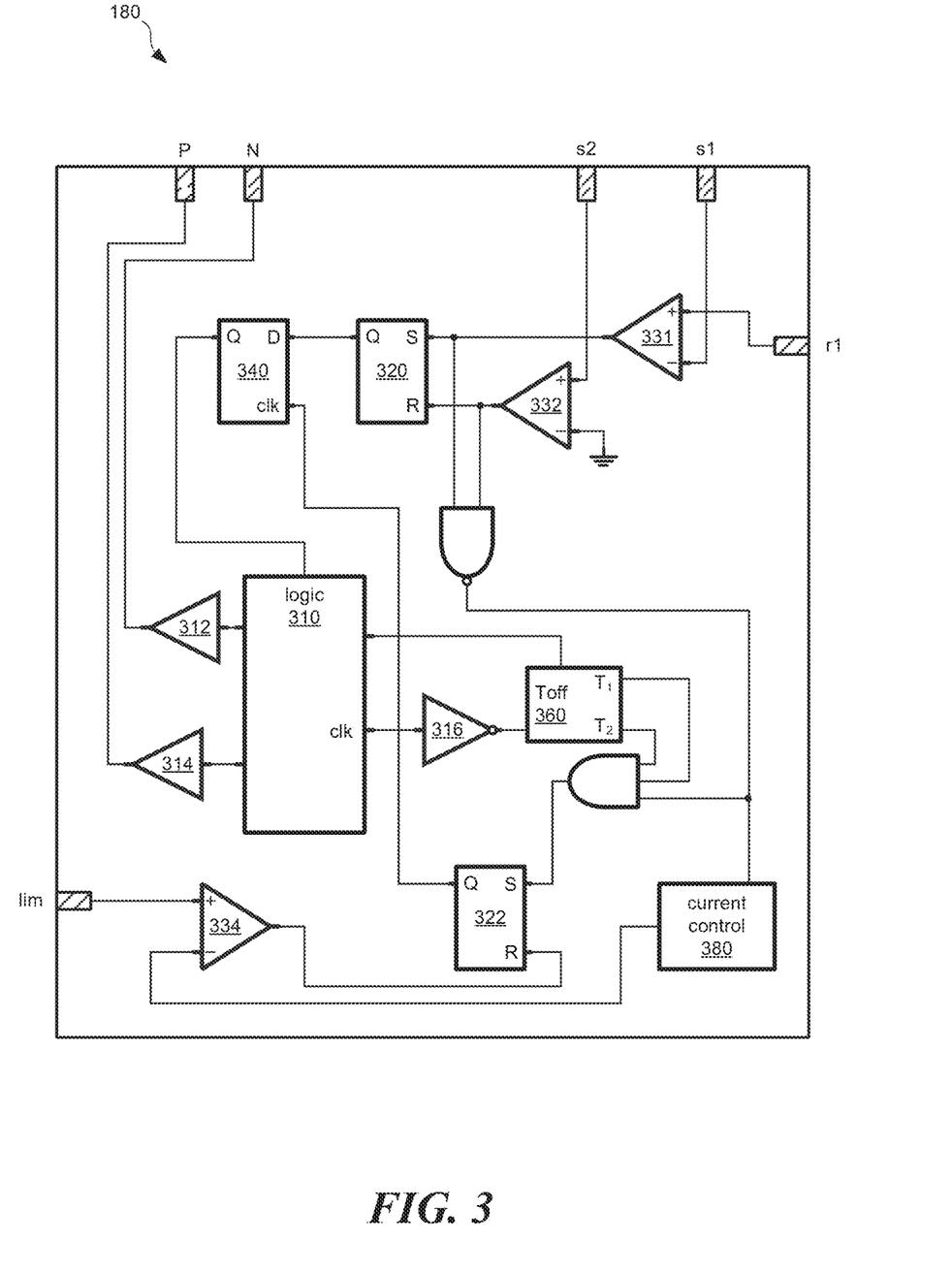
FIG. 3, depicts components of a switch control for a single-inductor boost converter, according to some embodiments.

Some components of the switch control 180 are depicted in FIG. 3, according to some embodiments. In some implementations, the switch control 180 may utilize current-limit control and combine aspects of pulse width modulation (PWM) and pulse frequency modulation (PFM) to determine when to drive current through the inductor L1. In PWM, a first comparator 331 senses the high voltage output from the boost converter (appearing across capacitor C1, referring to FIG. 1), and sets a status signal at a first resettable latch 320. A negative-voltage crossing (appearing across capacitor C2) sensed at the negative-voltage output Vn and compared with a second comparator 332 determines when the first latch 320 is reset. An internal clock circuit, comprising a second latch 322, a clocked flip-flop 340, and a selectable off-period circuit 360 may receive a clock signal from central logic 310 of the switch control 180 and receive inputs from AND gates indicating the voltage status on the boost converter outputs and current level applied to the inductor L1. The internal clock may have a variable period or frequency. According to some embodiments, the central logic 310 may select a first off-period $T_1$ of the internal clock and drive output buffers 312, 314 (which drive gates of transistors M1, M2) using the first off-period $T_1$ until the sensed high-voltage reaches a first threshold value. Then the central logic 310 may select a second off-period $T_2$ at which to alternatingly apply voltage across the inductor L1 until the current in the inductor reaches a first threshold value. Subsequently, the central logic 310 may select the first off-period $T_1$ for allowing current to dissipate from the inductor L1, and the cycle of applying and dissipating current from the inductor may be repeated using two different off-periods. Circuitry for sensing current in the inductor and comparing against threshold values may include current control circuitry 380 that outputs a reference voltage value to a third comparator 334. The third comparator may receive an input from a current limit contact (labeled "$I_s$" in the drawing) that connects to an end of the inductor L1.

Methods for biasing PIN diodes using the above-described circuits may also be implemented. For example, a method for biasing PIN diodes with a driver circuit assembled on a substrate may comprise acts of receiving, at the driver circuit, a first supply voltage and increasing, with a boost converter assembled on the substrate, the first supply voltage to a second voltage. A method may also include acts of reducing, with a low-dropout regulator assembled on the substrate, the second voltage to a third voltage, and powering, with an output from the low-dropout regulator, one or more PIN diode bias drivers that is or are assembled on the same substrate. Output from the one or more bias drivers may be applied to one or more PIN diodes to, for example, switch RF signals in communication or radar applications, or bias photodiodes for time-gated detection in optical applications.

CONCLUSION

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A driver circuit for biasing PIN diodes comprising:
   a substrate on which the driver circuit is assembled;
   a supply voltage contact configured to receive electrical power from a power source;
   a boost converter connected to the supply voltage contact and configured to increase a first voltage received from the power source to a second voltage;
   a low-dropout regulator configured to convert the second voltage to a third voltage; and
   PIN diode bias driver circuitry connected to an output of the low-dropout regulator and arranged to bias at least one PIN diode.

2. The driver circuit of claim 1, wherein the boost converter comprises two transistors and switching circuitry configured to switch current through an inductor that attaches to two inductor contacts on the substrate that are connected to the two transistors.

3. The driver circuit of claim 2, wherein an input of the low-dropout regulator is arranged to connect to a cathode of a diode having an anode that connects to the inductor.

4. The driver circuit of claim 1, wherein the first voltage is between approximately 2.5 volts and approximately 7 volts and the second voltage is between approximately 20 volts and approximately 35 volts.

5. The driver circuit of claim 4, wherein the third voltage is less than the second voltage and is between approximately 19 volts and approximately 34 volts.

6. The driver circuit of claim 1, wherein the supply voltage contact is the only contact for receiving power that powers the driver circuit.

7. The driver circuit of claim 1, wherein the PIN diode bias driver circuitry comprises:
   a receive PIN diode biasing circuit connected to an output of the low-dropout regulator;
   a transmit PIN diode biasing circuit connected to the output of the low-dropout regulator; and
   a shunt PIN diode biasing circuit connected to the output of the low-dropout regulator.

8. The driver circuit of claim 7, further comprising a TTL buffer configured to receive commands to activate or deactivate the receive PIN diode biasing circuit, the transmit PIN diode biasing circuit, and the shunt PIN diode biasing circuit.

9. The driver circuit of claim 8, wherein the TTL buffer is further configured to output an enable signal that indicates when at least one of the receive PIN diode biasing circuit, the transmit PIN diode biasing circuit, or the shunt PIN diode biasing circuit is activated.

10. The driver circuit of claim 7, wherein one or more of the receive PIN diode biasing circuit, the transmit PIN diode biasing circuit, and the shunt PIN diode biasing circuit comprises:
    a first transistor having a drain connected to receive an output voltage from the low-dropout regulator;
    a first buffer configured to receive power from the low-dropout regulator, to be referenced to a reference voltage that is less than a voltage from the low-dropout regulator and greater than zero volts, and to drive a gate of the first transistor;
    a second transistor having a drain connected to a source of the first transistor; and
    a second buffer configured to drive a gate of the second transistor.

11. The driver circuit of claim 10, wherein the reference voltage is between 2.5 volts and 7 volts less than a voltage received from the low-dropout regulator.

12. The driver circuit of claim 10, further comprising:
a first level shifter having an output connected to an input of the first buffer; and
a second level shifter having an output connected to an input of the second buffer.

13. The driver circuit of claim 1, further comprising plural PIN diodes assembled on the substrate and connected to the PIN diode bias driver circuitry.

14. The driver circuit of claim 13, further comprising:
an antenna contact coupled to a node between a receive PIN diode and a transmit PIN diode of the plural PIN diodes;
a receive contact coupled to a node between the receive PIN diode and a shunt PIN diode of the plural PIN diodes; and
a transmit contact coupled to the transmit PIN diode, wherein the PIN diode bias driver circuitry is configured to bias the plural PIN diodes to switch RF signals from or to the antenna contact between the receive contact and the transmit contact.

15. The driver circuit of claim 14, further comprising a low noise amplifier assembled on the substrate and connected to a cathode of the receive PIN diode.

16. A method for biasing PIN diodes with a driver circuit, the method comprising:
receiving, at the driver circuit assembled on a substrate, a first supply voltage;
increasing, with a boost converter assembled on the substrate, the first supply voltage to a second voltage;
reducing, with a low-dropout regulator assembled on the substrate, the second voltage to a third voltage; and
powering, with an output from the low-dropout regulator, PIN diode bias driver circuitry that is assembled on the substrate.

17. The method of claim 16, wherein the first supply voltage is the only supply voltage received by the driver circuit.

18. The method of claim 16, wherein increasing the first supply voltage to the second voltage comprises switching two transistors to drive current through a single inductor.

19. The method of claim 16, wherein the first supply voltage is between approximately 2.5 volts and approximately 7 volts and the second voltage is between approximately 20 volts and approximately 35 volts.

20. The method of claim 19, wherein the third voltage is less than the second voltage and is between approximately 19 volts and approximately 34 volts.

21. The method of claim 16, further comprising:
referencing first buffers in the PIN diode bias driver circuitry with a reference voltage that is between 2.5 volts and 7 volts less than an output voltage from the low-dropout regulator and greater than zero volts; and
powering, with the first supply voltage, second buffers in the PIN diode bias driver circuitry, wherein the first buffers and second buffers drive are configured to drive first and second transistors that output a bias voltage.

22. The method of claim 16, further comprising transmitting single-bit control signals to the PIN diode bias driver circuitry that alter a bias on the PIN diodes.

23. The method of claim 22, wherein the PIN diodes are assembled as a switch on the substrate and wherein the control signals cause the PIN diodes to switch RF signals between a receive port and a transmit port of the driver circuit.

24. The method of claim 23, further comprising:
providing an enable signal for an amplifier responsive to activating the PIN diodes to be in a first state; and
activating the amplifier responsive to receiving the enable signal.

25. The method of claim 24, wherein the amplifier is a low-noise amplifier connected to the receive port.

* * * * *

UNITED STATES PATENT AND TRADEMARK OFFICE
CERTIFICATE OF CORRECTION

PATENT NO. : 10,110,218 B2  
APPLICATION NO. : 15/356322  
DATED : October 23, 2018  
INVENTOR(S) : Brendan Foley et al.

Page 1 of 1

It is certified that error appears in the above-identified patent and that said Letters Patent is hereby corrected as shown below:

On the Title Page

At Item (72), Inventors:  
At Line number 4, add the following name:  
Chi Mo, Irvine, CA (US)

Signed and Sealed this  
Seventeenth Day of March, 2020

Andrei Iancu  
*Director of the United States Patent and Trademark Office*